United States Patent [19]
Cosgrove

[11] Patent Number: 5,992,611
[45] Date of Patent: Nov. 30, 1999

[54] CONCURRENT COMPONENT MOUNTER AND METHOD OF CONCURRENTLY MOUNTING COMPONENTS

[75] Inventor: Steven John Cosgrove, Singapore, Singapore

[73] Assignee: Motorola, Inc., Schaumburg, Ill.

[21] Appl. No.: 09/063,539

[22] Filed: Apr. 21, 1998

[51] Int. Cl.⁶ .................................................. B65G 47/30
[52] U.S. Cl. ...................................... 198/418.1; 414/799
[58] Field of Search .............................. 29/830, 832, 840, 29/739, 740, 431; 228/248.1, 253, 180.22, 212, 254; 198/418.1; 414/267, 799

[56] References Cited

U.S. PATENT DOCUMENTS

| | | | |
|---|---|---|---|
| 3,963,456 | 6/1976 | Tsuchiya et al. | 29/203 |
| 4,451,324 | 5/1984 | Ichikawa et al. | 29/739 |
| 4,459,743 | 7/1984 | Watanabe et al. | 29/740 |
| 4,587,703 | 5/1986 | Azizi et al. | 29/431 |

*Primary Examiner*—Lee Young
*Assistant Examiner*—Sean Smith
*Attorney, Agent, or Firm*—Dale W. Dorinski

[57] ABSTRACT

A concurrent component mounter (1) having storage hoppers (2) and a template (3) with component dispensing outlets (4). The mounter (1) also has communication passages (5) each providing communication between respective hoppers (2) and one of the dispensing outlets (4). Associated with each of the hoppers (2) is a component agitator (6). There is also a circuit board conveyor (22) and a circuit board fiducial detector (23) operatively coupled to a controller (24). Tracks (25,26) with associated drives (27,28) are operatively coupled to the controller (24) to effect movement of the template (3) along two axes (A,B).

8 Claims, 2 Drawing Sheets

CONCURRENT COMPONENT MOUNTER AND METHOD OF CONCURRENTLY MOUNTING COMPONENTS

FIELD OF THE INVENTION

This invention relates to a concurrent component mounter and method of concurrently mounting components. The invention is particularly useful for, but not necessarily limited to, concurrently mounting surface mountable electrical components onto a circuit board.

BACKGROUND ART

Component feeding is a well-known process in Surface Mounting Technology (SMT). In general, a feeder is used to sequentially supply surface mountable electrical components to a pick up location for subsequent placing, by a pick-and-place machine, onto a Printed Circuit Board (PCB) which is pre-printed with solder paste.

One form of feeder is a tape and reel feeder in which the electrical components are packaged on a tape that is wound onto a reel. The tape comprises individual pockets each containing one of the electrical components that are individually sealed in the pockets by a covering of thin film. In use, the film is removed when the tape enters the pick up location therefore leaving a pocket containing one of the electrical components in a position accessible by the pick-and-place machine. Unfortunately, the tape is substantially wider than the components located in the pockets which therefore increases the width of the feeder. Further, the reel and apparatus for removing the film also adds to the width and overall size of the feeder.

Hopper feeders also known as bulk or tube feeders are an alternative to tape and reel feeders. Hopper feeders comprise a hopper in communication, along a downwardly sloping passage, with the pick up location. The downwardly sloping passage makes use of gravity for supplying the components to the pick up location. To further assist the supplying of the components to the pick up location a combination of gravity and air blasting has also been used.

The pick up location of such hopper feeders has an abutment wall and an aperture. The abutment wall abuts the components supplied from the hopper before they are removed, through the aperture, by the pick-and-place machine. The supply of components to the pick up location must be controlled, otherwise undesirable amounts of friction between the abutment wall and an abutting component can result. This friction is due to a mass of stacked components in the downwardly sloping passage pushing the abutting components into the abutment wall. Accordingly, this friction may cause problems when the pick-and-place machine attempts to remove the abutting component. Further, unnecessary friction between the abutting component and an adjacent component can further hinder the removal of the abutting component.

In order to reduce the friction described above, the supply of components to the pick up location is mechanically controlled to separate components in the downwardly sloping passage from a component in the pick up location. For example, one conventional approach is to use a pneumatically controlled slotted disk located horizontally in series between the pick up location and sloping passage. The slotted disk has two diametrically opposite slots for sequentially engaging a component. The disk rotates through 180 degrees in a timed sequence to thereby transport an individual component, engaged in one of the slots, from the passage to the pick up location.

In use, both conventional hopper feeders or tape and reel feeders are positioned on either sides of a conveyor track extending along a length of a pick-and-place machine. The conveyor track transports printed circuit boards into an area of the pick-and-place machine to allow components, fed from the hopper feeders or tape and reel feeders, to be mounted to the circuit boards. Such pick-and-place machines are expensive and their high speed moving parts are subject to wear and high maintenance costs. Further, each component is sequentially mounted to the printed circuit board which is time consuming and therefore can result in increased manufacturing overheads.

In U.S. Pat. No. 4,451,324 there is disclosed an apparatus for placing electronic components on a circuit board. This apparatus has a template which is supplied with components from hoppers. The template is then moved to a position in alignment with and adjacent to the circuit board to allow connector pads of the components on the template to be aligned with corresponding pads located on an underside of the circuit board. The combination of the template and board are then rotated 180 degrees so that the components are located on top of the circuit board. The template is then removed and the components connector pads can then be soldered to the corresponding pads on the board. Although this apparatus concurrently places electronic components on a circuit board, it is unnecessarily slow due to the required movement of the template to the position in alignment with and adjacent to the circuit board. Delays are also caused by the rotation of the template and board which may also cause component misalignment.

SUMMARY OF THE INVENTION

It is an aim of this invention to overcome or alleviate at least one of the problems associated with mounting electrical components onto a circuit board or any other electrical substrate.

According to one aspect of this invention there is provided a concurrent component mounter for mounting electrical components onto a circuit board, the mounter comprising:

a plurality of component storage hoppers;

a template with a plurality of component dispensing outlets therein;

least one of said component storage hoppers and an associated one of said component dispensing outlets;

a component agitator associated with each of said component storage hoppers;

a circuit board conveyor having a section thereof disposed in close proximity to said component dispensing outlets;

a circuit board fiducial detector;

a controller operatively coupled to said fiduciary detector;

one or more tracks having one or more associated drives, said drives being operatively coupled to said controller and said template being movably coupled to said tracks;

a plurality of component retainers each associated with a respective one of said of component dispensing outlets; and a plurality of component dispensers each associated with a respective one of said of component dispensing outlets.

Suitably, each said component agitator may be an agitator fluid jet outlet operatively coupled to a controlled compressed fluid supply.

Preferably, said agitator fluid jet outlet may be located adjacent an outlet of a respective one of said associated hoppers.

Suitably, said component retainers may each comprise a retainer fluid jet outlet operatively coupled to a controlled compressed fluid supply.

Preferably, said retainer fluid jet outlet may have a plunger therein, said plunger having and abutment surface for abutting and restricting dispensing of electrical components in said respective one of said communication passages.

Suitably, said plunger may be biased to a position restricting said dispensing. However, the plunger may be biased to a position allowing said dispensing. In another form said plunger may be unbiased.

In an alternative form said component retainers may comprise one or more shutters.

Preferably, said component dispensers may each comprise a dispensing fluid jet outlet operatively coupled to a controlled compressed fluid supply.

Suitably, said component dispensers may allow for a compressed fluid supply to provide a force to dispense an electrical component through a respective one of said dispensing outlets and onto a circuit board thereunder.

Preferably, said controller in response to signals from said fiducial detector may control said drives to align pads of said circuit board with a respective one of said component dispensing outlets.

According to another aspect of this invention there is provided a method of concurrently mounting electrical components onto a circuit board, the method comprising the steps of:

automatically supplying the electrical components to respective component dispensing outlets;

retaining said components at said component dispensing outlets until pads the circuit board are aligned with a corresponding one of said component dispensing outlets; and concurrently dispensing said components retained in said outlets directly onto said circuit board.

Preferably, the method may be effected by the concurrent component mounter as described hereinabove.

BRIEF DESCRIPTION OF THE DRAWINGS

In order that the invention may be readily understood and put into practical effect, reference will now be made to a preferred embodiment illustrated in the accompanying drawings in which.

DETAILED DESCRIPTION OF THE PREFERRED EMBODIMENTS OF THE INVENTION

Figure 1:
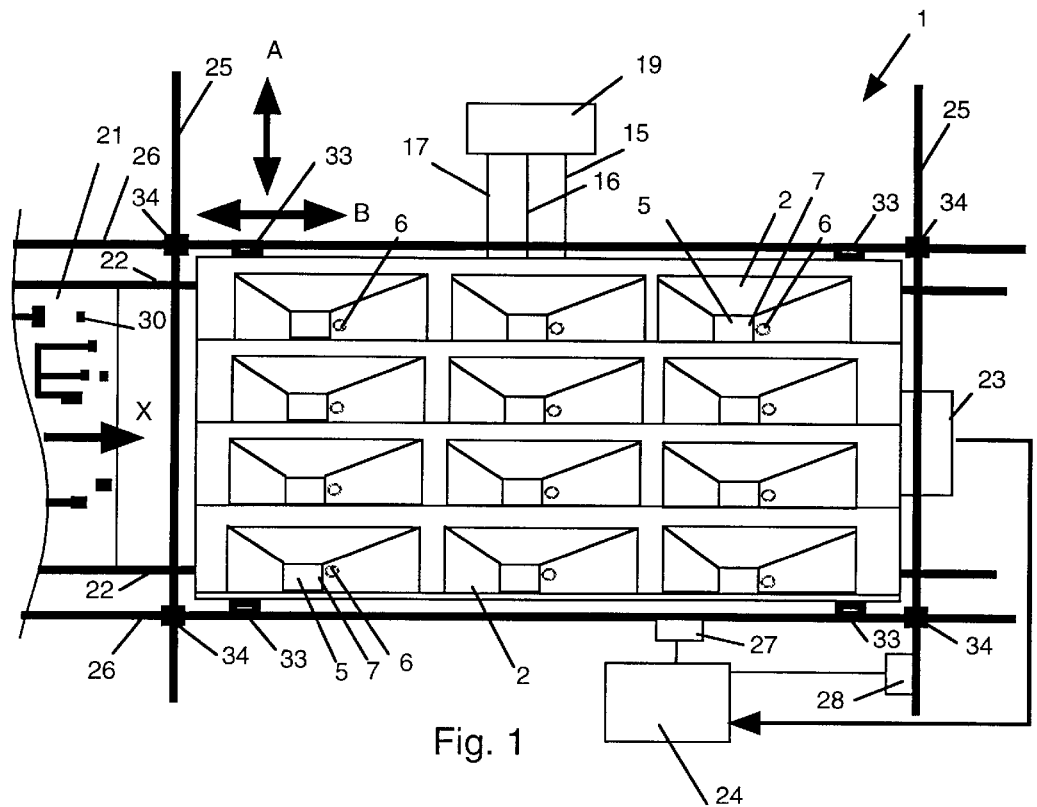
FIG. 1 is a schematic top plan view of a preferred embodiment of a concurrent component mounter in accordance with the invention.
Figure 2:
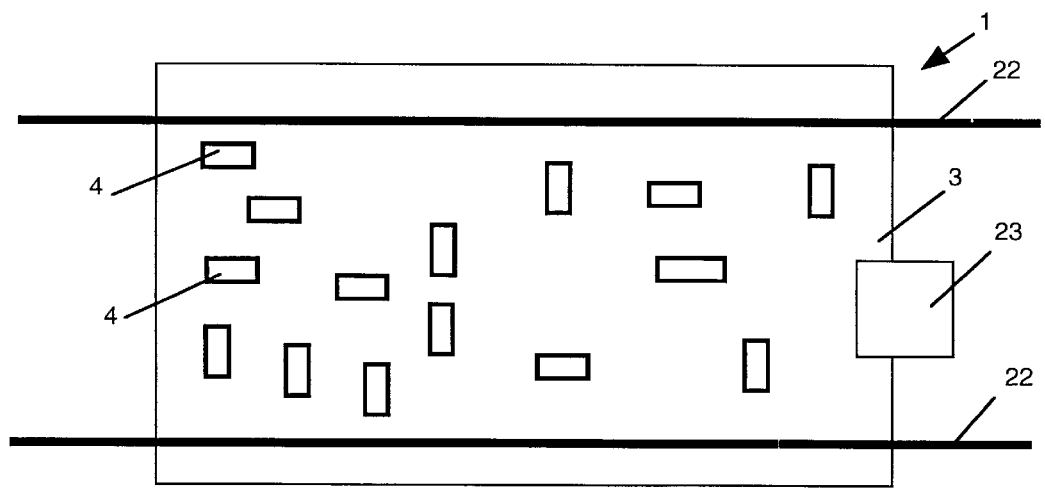
FIG. 2 is an underside plan view of part of the concurrent component mounter of FIG. 1.
Figure 3:
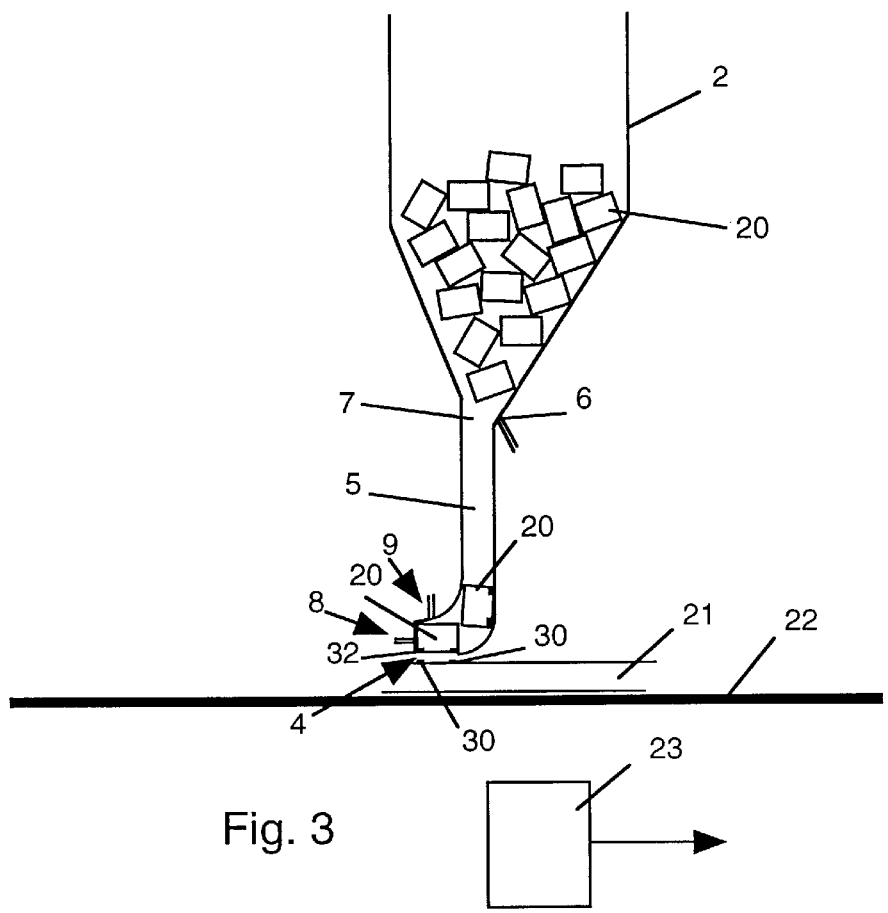
FIG. 3 illustrates part of the concurrent component mounter of FIG. 1.
Figure 4:
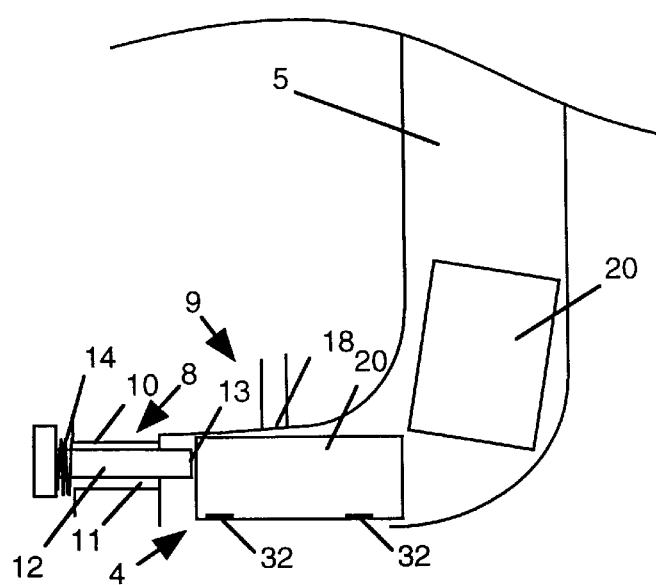
FIG. 4 illustrates in detail one component retainer and one dispenser of the embodiment of FIG. 1.

Referring to FIGS. 1 to 4 there is illustrated a concurrent component mounter 1 for mounting electrical components 20 electrical components to a circuit board 21. The concurrent component mounter 1 comprises a plurality of storage hoppers 2 and a template 3 with a plurality of component dispensing outlets 4 each being in communication with one of the hoppers 2 by a respective communication passage 5.

Accordingly, the communication passage 5 allows the electrical components 20 in a respective one of the hoppers 2 to transferred to one of the component dispensing outlets 4.

There is a component agitator in the form of a fluid jet outlet 6 located adjacent a hopper outlet 7 of each of the hoppers 2. Each fluid jet outlet 6 is operatively coupled by a conduit 15 to a controlled compressed fluid supply 19. Associated with each of the component dispensing outlets 4 is a component retainer 8 and a component dispenser 9. In this embodiment the component retainer 8 comprises a retainer fluid jet outlet 11, a shouldered aperture 10 and a plunger 12 operatively coupled to the controlled compressed fluid supply 19 by a conduit 16. The plunger 12 has an abutment surface 13 for abutting and restricting dispensing of the electrical components 20. Further, the plunger 12 is biased by a compression spring 14 to a position allowing dispensing of the electrical components 20.

The component dispenser 9 comprises a dispensing fluid jet outlet 18 operatively coupled to the controlled compressed fluid supply 19 by a conduit 17.

The concurrent component mounter 1 has a circuit board conveyor 22 having a section disposed in close proximity to the component dispensing outlets 4. There is also a circuit board fiducial detector 23 operatively coupled to a controller 24. To allow alignment of the component dispensing outlets 4 and respective pads 30 of the circuit board 21, the template 3 is movably coupled to tracks 25,26. In this regard, the template 3 is coupled to tracks 26 by wheels 33 to allow the template to move in a direction illustrated by arrowhead line B. There are also wheels 34 that are pivotally mounted on tracks 26 provided coupling to track 25 to allow the template to move in a direction illustrated by arrowhead line A. Both sets of tracks 25,26 are operatively coupled to drives 27, 28 that are controllable by controller 24.

In use, the components 20 in each of the hoppers 2 are agitated by air blasts, provided by the controlled compressed fluid supply 19, through the associated fluid jet outlet 6. Accordingly, the components 20 will drop into their respective communication passage 5. When the component reaches the dispensing outlet 4, the biased plunger 12 will retain it until the respective pads 30 of the circuit board 21 are in alignment with the associated dispensing outlet 4. This alignment is achieved by the circuit board 21 being conveyed in a conveying direction (shown by arrow X) to a stationary position under the template 3. The circuit board fiducial detector 23 then provides error signals to controller 24. In response to these error signals the controller 24 controls dives 27,28 to effect any required alignment movement of template along two axes illustrated by arrowhead lines A and B.

Once the respective pads 30 of the circuit board 21 are in alignment with the associated dispensing outlet, air pressure from the controlled compressed fluid supply 19 is removed from the component retainer 8. This causes the biased plunger 12 to move away from its associated retained component 20. At substantially the same instance, an air blast effected by the controlled compressed fluid supply 19 is supplied to the dispensing fluid jet outlet 18 thereby providing a force to concurrently mount each of the components onto the circuit board 21, Hence, pads 32 of the components 20 are mounted firmly, directly and concurrently onto aligned pads 30 of the circuit board.

The present invention allows for rapid and accurate mounting of components without the need for expensive rapid moving pick-and-place machines with high maintenance costs.

Although this invention has been described with reference to a preferred embodiment, it is to be understood that the invention is not limited to the specific embodiment described herein.

What is claimed is:

1. A concurrent component mounter for mounting electrical components onto a circuit board, the mounter comprising:

a plurality of component storage hoppers for containing a plurality of electrical components;

a template with a plurality of component dispensing outlets therein;

communication passages each providing communication between at least one of said component storage hoppers and an associated one of said component dispensing outlets;

a component agitator associated with each of said component storage hoppers;

a circuit board conveyor having a section thereof disposed in close proximity to said component dispensing outlets;

a circuit board fiducial detector;

a controller operatively coupled to said fiducial detector;

one or more tracks having one or more associated drives, said drives being operatively coupled to said controller and said template being movably coupled to said tracks;

a plurality of component retainers each associated with a respective one of said of component dispensing outlets; and a plurality of component dispensers for dispensing the electrical components onto the circuit board, each component dispenser associated with a respective one of said of component dispensing outlets.

2. A concurrent component mounter as claimed in claim 1, wherein each said component agitator is an agitator fluid jet outlet operatively coupled to a controlled compressed fluid supply.

3. A concurrent component mounter as claimed in claim 2, wherein said agitator fluid jet outlet is located adjacent an outlet of a respective one of said associated hoppers.

4. A concurrent component mounter as claimed in claim 1, wherein said component retainers each comprise a retainer fluid jet outlet operatively coupled to a controlled compressed fluid supply.

5. A concurrent component mounter as claimed in claim 4, wherein said retainer fluid jet outlet has a plunger therein, said plunger having and abutment surface for abutting and restricting dispensing of electrical components in said respective one of said communication passages.

6. A concurrent component mounter as claimed in claim 1, wherein said component dispensers may each comprise a dispensing fluid jet outlet operatively coupled to a controlled compressed fluid supply.

7. A concurrent component mounter as claimed in claim 1, said component dispensers allow for a compressed fluid supply to provide a force to dispense an electrical component through a respective one of said dispensing outlets and onto a circuit board thereunder.

8. A concurrent component mounter as claimed in claim 1, wherein said controller in response to signals from said fiducial detector controls said drives to align pads of said circuit board with a respective one of said component dispensing outlets.

* * * * *